United States Patent [19]

Chambers et al.

[11] 4,335,197
[45] Jun. 15, 1982

[54] PHOTOIMAGING PROCESS

[75] Inventors: William J. Chambers; Louis Plambeck, Jr., both of Wilmington, Del.

[73] Assignee: E. I. Du Pont de Nemours and Company, Wilmington, Del.

[21] Appl. No.: 210,232

[22] Filed: Nov. 25, 1980

[51] Int. Cl.$^3$ .................................................. G03C 5/00
[52] U.S. Cl. .................................. 430/271; 430/277; 430/278; 430/292; 430/294; 430/381; 430/448
[58] Field of Search ............... 430/271, 275, 277, 278, 430/292, 294, 381, 448

[56] References Cited

U.S. PATENT DOCUMENTS

| | | | |
|---|---|---|---|
| 2,310,943 | 2/1943 | Dorough et al. | 430/381 |
| 2,397,864 | 4/1946 | Jennings et al. | 430/548 |
| 2,397,865 | 4/1946 | Jennings et al. | 430/381 |
| 3,070,442 | 12/1962 | Cohen et al. | 430/294 |
| 3,440,049 | 4/1969 | Moede | 430/264 |
| 3,904,418 | 9/1975 | Mowrey et al. | 430/559 |
| 4,137,080 | 1/1979 | Fujiwhara et al. | 430/402 |
| 4,211,561 | 7/1980 | Plambeck | 430/381 |

OTHER PUBLICATIONS

Tull, Journal of Photographic Science, vol. 24, pp. 158–167, 1976.
James, The Theory of Photographic Process, Fourth ed., pp. 298–327, 347, 348, 353 and 354, MacMillan Publ. Co., New York.

*Primary Examiner*—J. Travis Brown
*Attorney, Agent, or Firm*—James A. Costello

[57] ABSTRACT

A method for producing a photopolymer image comprising (a) exposing, imagewise, a photosensitive element to actinic radiation, said element comprising a substrate coated with a photosensitive layer containing dispersed silver halide particles in operative association with a continuous film-forming phase of polymeric coupler, said coupler having (i) a number average molecular weight of about 2,000 to 100,000, (ii) a content of about 10 to 100 milliequivalents per 100 g of polymeric coupler of acidic methylene coupler groups and about 15 to 175 milliequivalents per 100 g of polymeric coupler of at least one of carboxylic, sulfonic and phosphonic acid groups, and (iii) the ability to couple with a monofunctional developing agent thus becoming water-insoluble; (b) developing (insolubilizing) the latent image; and (c) removing the undeveloped, soluble portion of the photosensitive element by washing with aqueous solvent.

17 Claims, No Drawings

PHOTOIMAGING PROCESS

BACKGROUND OF THE INVENTION

1. Field of the Invention

This invention concerns a photoimaging process wherein a photosensitive element having a substrate layered with silver halide particles in operative association with a polymeric coupler is latently imaged, treated with a monofunctional-coupling developer to render the imaged area insoluble in aqueous solvent, and washed with aqueous solvent to remove the undeveloped portion of the silver halide/polymeric coupler layer.

2. Background Publications

The use of dye-forming polymeric polyfunctional couplers in color photography is known. U.S. Pat. No. 2,310,943 to Dorough et al. describes the use of a polyvinyl acetal carrying phenolic color-former groups, e.g., polyvinyl salicylal, dispersed in a gelatin/silver halide photographic emulsion. Exposure to light followed by development with a color-forming developer, e.g., p-aminodiethylaniline, gave a colored image. Dorough et al. also disclose use of acetal interchange to obtain a polyvinyl acetal carrying phenolic color-former groups and carboxylic acid groups. Washout of unexposed, undeveloped areas is not disclosed.

U.S. Pat. Nos. 2,397,964 and 2,397,865 to Jennings et al. disclose the use of the same acetals disclosed by Dorough et al. and related hydrophilic polymeric color-formers as the sole film-forming carrier for silver halide in a color film. The polymeric color-former is insoluble in water at 30° C., and development is carried out with a conventional color-forming developer. Washout of unexposed, undeveloped areas is not disclosed.

Procedures are known whereby exposed gelatin/silver halide layers are developed under conditions that cause tanning of the gelatin in the exposed areas. Such procedures have been used to prepare gelatin relief images in the imbibition printing of color pictures, e.g., Tull, J. Photog. Sci., 24, 158 to 167 (1976). Monofunctional developers are used as gelatin tanning agents in such procedures. U.S. Pat. No. 3,440,049 to Moede describes the use of bi-functional developing agents.

U.S. Pat. No. 3,904,418 to Mowrey et al. discloses the use of a polymerized monomer containing at least one active methylene group as a component of a binding agent, useful in a photographic element adapted for silver-dye bleach processes. Conventional photographic developers are employed.

U.S. Pat. No. 4,137,080 to Fujiwhara et al. discloses a process for preparing color pictures by means of light-sensitive, photographic, silver halide reproducing materials in which development occurs with a polyfunctional developing agent in the presence of a polyfunctional coupler, e.g., an aminophenol. Washout of unexposed undeveloped areas is not disclosed.

U.S. Pat. No. 4,211,561 to Plambeck discloses a method for producing a cross-linked polymeric image on a substrate which comprises exposing a photosensitive layer containing dispersed silver halide in operative association with a multifunctional hydrophilic polymeric coupler, developing the exposed layer with a multifunctional developing agent, and removing the undeveloped, noncross-linked areas by washing with a solvent. The patent is silent concerning monofunctional developing agents. For a discussion of polymeric couplers, see "The Theory of the Photographic Process", Fourth Edition, edited by T. H. James, Macmillan Publishing Co., Inc., New York, 1977, pages 347 and 348; and for a discussion of conventional monofunctional developing agents, see pages 298 to 327, 353 and 354.

SUMMARY OF THE INVENTION

This invention concerns a method for forming an image, comprising:
- (a) exposing, imagewise, a photosensitive element to actinic radiation, the element comprising a substrate coated with a photosensitive layer containing dispersed silver halide particles in operative association with a continuous film-forming phase of polymeric coupler, the coupler characterized by
  - (i) a number average molecular weight of about 2,000 to 100,000;
  - (ii) a content of about 10 to 100 milliequivalents per 100 g of polymeric coupler of coupler groups and about 15 to 175 milliequivalents per 100 g of polymeric coupler of at least one of carboxylic, sulfonic and phosphonic acid groups; and
  - (iii) the ability to couple with a monofunctional developing agent and thereby become insoluble in aqueous solvents;
- (b) developing the layer containing the latent image with a monofunctional developing agent capable of selectively reducing the silver halide in the latent image area and, in its oxidized state, of coupling with the polymeric coupler in the latent image area, thereby insolubilizing the coupler in the form of an image; and
- (c) removing the undeveloped, soluble areas of the polymeric coupler by washing with aqueous solvent.

It is preferred that the coupler comprise 30 to 80 meq per 100 g of polymeric coupler of coupler groups, and 20 to 165 meq per 100 g of polymeric coupler of at least one of the carboxylic, sulfonic and phosphonic acid groups. Preferred couplers contain acetoacetate or pyrazolone coupling groups and are between 5,000 and 60,000 in molecular weight. Preferred substrates include aluminum, copper and oriented polyethylene terephthalate film. The preferred developer is 4-amino-3-methyl-N-ethyl-N-($\beta$-hydroxyethyl)aniline sulfate.

DETAILS OF THE INVENTION

The Substrate And Element Fabrication

The photosensitive elements described herein comprise coatings applied to a wide variety of substrates. By "substrate" is meant any natural or synthetic support, preferably one which is capable of existing in a flexible or rigid film or sheet form. For example, the substrate can be glass, a metal sheet or foil such as copper, aluminum, or stainless steel; a sheet or film of synthetic organic resin; cellulose paper; fiberboard; or a composite of two or more of these materials.

Other substrates include wood, cloth, and cellulose esters, e.g., cellulose acetate, cellulose propionate, cellulose butyrate, and the like. Also suitable are films or plates composed of various film-forming synthetic resins or high polymers, such as the addition polymers, in particular the vinylidene polymers such as vinyl chloride polymers, vinylidene chloride copolymers with vinyl chloride, vinyl acetate, styrene, isobutylene, and acrylonitrile; vinyl chloride copolymers with the latter polymerizable monomers; linear condensation polymers such as the polyesters, e.g., polyethylene terephthalate; polyamides, e.g., polyhexamethylene sebacamide; polyester amides, e.g., polyhexamethylene adipamide/adipate, and the like. Preferred substrates include thin and flexible grained aluminum sheets, steel sheets, copper, oriented polyethylene terephthalate film, polyvinylidene chloride copolymercoated oriented polyester film, and gelatin-coated oriented polyester film.

Fillers or reinforcing agents can be present in the synthetic resin or polymer bases, including synthetic, modified or natural fibers, e.g., cellulosic fibers such as cotton, cellulose acetate, viscose rayon and paper. Also useful are glass wool, nylon, and the like. These reinforced bases can be used in laminated form.

Choice of substrate will usually depend upon the use application involved. For example, the photosensitive compositions of this invention, on aluminum, are particularly useful for the preparation of lithographic plates. Aluminum substrates are available commercially in a wide variety of thicknesses. The aluminum can be untreated (except for the thin layer of oxide which forms immediately at its surface when exposed to air), or it can be provided with surface treatments or coatings to leave a hydrophilic or less reactive surface. The surface can be roughened (mechanically, chemically, or electrochemically) to improve retention of aqueous liquids and to improve adhesion to strata to be applied thereon.

The photosensitive element will consist of one or more layers on the substrate. The element can also contain a top-coat or protective stratum. Such top-coats should be transparent to light and permeable to the basic developer solution, preferably soluble in an aqueous alkaline solution. The layer or layers are usually applied to the substrate as a solution of dispersion in a carrier solvent. The solution or dispersion can be sprayed, brushed, applied by a roller or an immersion coater, flowed over the surface, picked up by immersion, spin-coated, or applied to the substrate by other suitable means. The solvent is then allowed to evaporate.

In general, solvents are employed which are volatile at ordinary pressures. Examples of suitable solvents include water, aqueous ammonia, aqueous solutions containing strongly basic organic amines, and mixtures of water with water-miscible organic solvents such as methanol, ethanol, butanol, 2-methoxyethanol, 2-ethoxyethanol, 2-butoxyethanol, and the like. When the photosensitive element contains a separate silver halide layer, the polymeric coupler layer can be applied to the substrate using an organic solvent such as chlorinated hydrocarbons, ketones, or alcohols, and the silver halide emulsion is subsequently applied from an aqueous solution. Silver halide can also be applied from an alcohol dispersion by processes wherein silver halide emulsions in water are diluted with water miscible solvents like acetone to precipitate the emulsion binder, i.e., gelatin, around the AgX grains and hence break the emulsion. The gelatin coated AgX grains are then filtered and redispersed in alcohol with the assistance of salicylic acid.

The thickness of the photosensitive element, after drying, is usually about 0.02 to 0.3 mil (0.5-7.5 $\mu$m). This corresponds to a coating weight of about 5 to 80 mg/dm$^2$. When the photosensitive element is employed for the preparation of lithographic printing plates, it is preferred to use a coating weight of about 7 to 40 mg/dm$^2$. Such a coating weight represents a level of silver halide of about 3.5 to 20 mg/dm$^2$.

The Silver Halide

The light-sensitive silver halide used in producing images by the process of this invention includes silver chloride, silver bromide, silver iodide, silver chlorobromide, silver iodobromide, and silver chloroiodobromide, either singly or in mixtures. Preparation of the halide can be carried out in the conventional manner in gelatin, or the halide can be formed directly in a solution of the polymeric coupler. The halide can be formed in gelatin, the gelatin removed, and the halide redispersed in a solution of the polymeric coupler. At least two equivalents of silver halide per equivalent of coupler groups are employed. In imaging systems in which all of the silver halide present is not developable, more than two equivalents of silver halide per equivalent of coupler groups may be needed, e.g., up to about fifteen equivalents.

The grain size distribution and sensitization of the silver halide can be controlled to make silver halides suitable for all classes of photographic materials including general continuous tone, X-ray, lithographic, microphotographic, direct positive, and the like. Ordinarily, the silver halide dispersions will be sensitized chemically with compounds of sulfur, gold, rhodium, selenium, and the like. They can also be sensitized spectrally with various sensitizing dyes such as cyanine, 1,1'-diethyl-4,4'-cyanine iodide, 1,1'-diethyl-2,2'-carbocyanine iodide, 1',3-diethylthia-4'-carbocyanine iodide and other methine and polymethine cyanine dyes, kryptocyanines, merocyanines, pseudocyanines, and others.

The Polymeric Coupler

The polymeric coupler is present as a continuous phase in operative association with silver halide particles which are dispersed in the polymeric coupler phase itself or in a layer of binder adjacent to the polymer coupler phase. Such a binder layer is preferably a gelatin layer overlying the polymeric coupler phase. Minor amounts of gelatin can be present in the polymeric coupler phase so long as the coupler provides the continuous phase.

Polymeric coupler molecular weights (number average) vary between about 2,000 to 100,000 as determined by gel permeation chromatography. Specific molecular weights needed for various utilities can be determined by balancing the ease of washing out the soluble areas against the need for good mechanical properties. For example, low molecular weight acetoacetate polymeric couplers are more easily removed in the soluble areas after development, but the films tend to be somewhat weak. Alternatively, high molecular weight acetoacetate polymeric couplers give films of good mechanical properties, but the soluble areas are difficult to remove by washout. When a low molecular weight polymeric coupler is employed, it should contain a relatively low concentration of acidic groups, e.g., carboxyl groups, so that imaged areas are sufficiently insoluble in aqueous solvents. Alternatively, when a high molecular weight polymeric coupler is used, a relatively high concentration of acidic groups may be required to provide adequate solubility of unimaged areas in aqueous solvents.

The polymeric couplers of the invention contain about 10 to 100 milliequivalents per 100 g of polymeric coupler of coupler groups to provide for effective insolubilization. They also contain about 15 to 175 milliequivalents per 100 g of polymeric coupler of acidic groups selected from the group consisting of carboxylic, sulfonic, and phosphonic acid groups. Carboxyl groups are preferred. The coupling of oxidized developer to coupler groups in basic solution provides for an effective solubility differential between developed and undeveloped polymeric coupler in aqueous solution. For best results, it has been found that the minimum ratio of coupler groups to acidic groups should be about 10/175 and the maximum ratio should be about 100/15.

The coupler groups can be any of the conventional coupler groups employed in color photography which are capable of coupling with an oxidized p-aminodialkylaniline to form a dye. Useful coupler groups include those having the structure

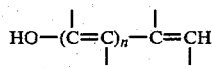

where n is 0 or 1. This structure is found in color formers which contain a reactive acyclic or intracyclic methylene group and in aromatic hydroxyl compounds. These groups occur in phenols (including naphthols), amines, aminophenols, bis-phenols, acylacetarylides, cyanoacetarylides, beta-ketoesters, pyrazolones, N-homophthalylamines, coumaranones, indoxyls, thioindoxyls, and the like. The reaction groups can also be termed reactive methylene, reactive ethenol and reactive 4-hydroxy-1,3-butadienyl groups. In all of the color-former nuclei the hydrogen atoms in the coupling position can be replaced by groups which are readily eliminated in the coupling reaction, e.g., halogen, such as Cl and Br, sulfonic acid, carboxylic acid, and the like.

The coupler groups can be attached to any suitable base polymer so as to obtain the polymeric couplers of the invention. Preferred base polymers include hydrolyzed copolymers of vinyl acetate and other conventional vinyl monomers; copolymers of acrylic acid, methacrylic acid, methacrylamide, and 2-hydroxyethyl methacrylate with other conventional vinyl monomers; poly(ethylene oxide); polyvinyl pyrrolidone; copolymers of maleic anhydride, and the like.

Preparation of polymers which contain coupler groups is usually accomplished by copolymerization of an ethylenically unsaturated monomer which contains a coupler group such as 1-phenyl-3-methacrylamido-5-pyrazolone, or the acetoacetic ester of $\beta$-hydroxyethyl methacrylate, with such other monomers as methyl methyacrylate, ethyl methacrylate, ethyl acrylate, propyl acrylate, methacrylic acid, acrylic acid, vinylphosphonic acid, vinylsulfonic acid, vinylbenzoic acid, p-vinylbenzenesulfonic acid, methyacrylamide, 2-hydroxyethyl methacrylate, and the like, to provide polymers which contain pyrazolone groups or acetoacetate groups attached to the polymer chain. The pyrazolone coupler group can be attached to a polymer chain by reaction of 1-p-aminophenyl-3-methyl-5-pyrazolone with anhydride groups in a polymer chain, e.g., with a styrene/maleic anhydride copolymer. Other useful ethylenically unsaturated monomers which contain color-forming coupler groups are disclosed in British Pat. No. 875,248 and include m-methacrylamidophenol, 5-methacrylamido-1-naphthol, p-methacrylamidophenol, o-methacrylamidophenol, p-methacrylamidoaniline, p-methacrylamidophenylacetonitrile, 1-phenyl-3-methacrylamido-5-pyrazolone, 2,4-dimethacrylamidophenol, m-methacrylamido-α-benzoylacetanilide.

Coupler groups can be attached as lateral substituents on the main chain of a base polymer using such conventional chemical processes as esterification, amidation, etherification, acetal formation, and the like. Thus, preparation of polymers which contain ketomethylene coupler groups can be carried out by polymer substitution reactions. For example, reaction of ethyl acetoacetate with a carboxyl-containing polyvinyl alcohol in an ester exchange reaction gives a polymer which contains a plurality of ketomethylene groups. Similar reaction of carboxyl-containing polyvinyl alcohol with amino and hydroxy-substituted aromatic aldehydes gives polyvinyl acetals with attached coupler groups.

Introduction of acidic groups into the polymeric coupler is preferably accomplished by copolymerization with an acidic group-containing monomer. Acidic groups can also be obtained by selective hydrolysis of ester groups attached to the polymer chain. The necessary acidic groups can also be introduced into a preformed polymer chain by suitable known procedures, such as the sulfonation of preformed styrene copolymers.

In addition to the usual sensitizers and sensitizing dyes used for conventional silver halide emulsions, the polymeric coupler phase can contain dyes and pigments to provide the required optical density of the final image. Pigments such as carbon black are preferred when a very high optical density is required. The layer can also contain a colorless, transparent mordant for dyes. When a mordant is present, the insolubilized layer, after removal of soluble areas, can be treated with a dye solution to increase optical density as the dye is adsorbed by the mordant. Such a system avoids the loss of imaging speed which could be experienced if the dye or pigment is present in the photosensitive layer during exposure to radiation.

If an image of high optical density is required, say, in the preparation of litho film, the dye or pigment that provides the density can be incorporated in the polymeric coupler phase which can, in turn, be overcoated with a photosensitive silver halide layer. The silver halide is most conveniently carried in an unhardened gelatin layer. With such an arrangement, essentially all of the light used for the exposure is available to the silver halide and none is lost by absorption by colorant. During development, the oxidized developing agent diffuses into the colored polymeric coupler phase to effect insolubilization.

The photosensitive element can also contain various conventional photographic additives such as coating aids like saponin, alkylarylsulfonic acids or sulfoalkylsuccinic acids; plasticizers such as glycerol or 1,5-pentanediol; antistatic agents; agents to prevent the formation of spots; antihalation colorants; and the like.

Exposure (Step (i))

Imagewise exposure of the photosensitive layer is conveniently carried out by exposing the layer by any of the usual procedures used with silver halide photographic materials, e.g., camera, cathode ray tube, light emitting diode, projection, contact or laser processes. Laser imaging is best done with compositions using silver halide spectrally sensitized to the laser output wavelength. Spectral sensitization can improve silver halide light absorption at desired wavelengths.

In most applications the original copy used for camera exposure will consist of black and white areas only; or, if used for contact or projection printing, it will consist of opaque and clear areas (process transparency). Exposures are normally made directly onto the photosensitive element. However, when high concentrations of colorant are present in the silver halide-containing layer, exposure is preferably made through a transparent substrate to provide proper anchorage of the image to the substrate. When the photosensitive element contains a pigmented polymeric coupler layer and a separate superior silver halide emulsion layer, exposure can be made directly onto the silver halide layer. If an appropriate concentration of light-absorbing dye or pigment is present throughout the thickness of the photosensitive element so that the light is attenuated as it passes through the element, exposures to continuous tone copy can be made through the transparent support. Alternatively, the exposed and developed layer can be transferred to another support before removing the undeveloped, soluble areas. The image obtained is of varying thickness and continuous tone.

The Developer And Step (ii)

The developing agent is of the monofunctional type which contains one group capable of selectively reducing a silver halide latent image and (in its oxidized state) capable of coupling with the coupler groups of the polymeric coupler. The polymeric couplers are insolubilized after exposure by treatment with the monofunctional developing agent in basic solution. The acidic groups of the polymeric coupler, in both imaged and unimaged areas, are concurrently converted to ionic salt groups by reaction with base in the developer solution. Since the coupler groups are attached to the polymer chains, insolubilization of the polymer chains in aqueous solvents, in the imaged areas, takes place as a result of the coupling reaction. Such coupling for acetoacetate coupler groups and N,N-diethyl-p-phenylenediamine developing agent is as follows:

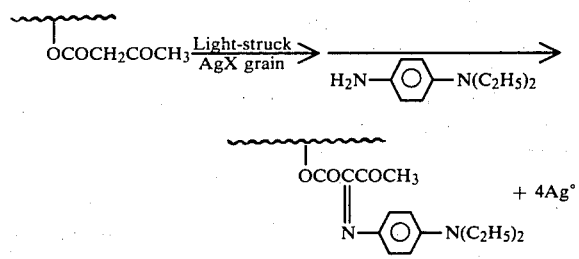

An essential requirement of the coupling reaction between the oxidized monofunctional developer and the polymeric coupler is that it forms a polymer image relatively insoluble in aqueous solvents compared with undeveloped polymeric coupler. Characteristic of proper development is a slight swelling of the polymeric coupler layer. Although development efficiency and coupling efficiency are important, the color of the image is not always important. Thus, many developers and couplers that would not be considered suitable for a color photography process of the prior art because of color deficiency are operable in the instant process.

Preferred developing agents have as their nucleus an active group having the general structure

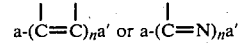

where a and a', alike or different, are OH, $NH_2$, NHR, or $NR_2$ with the proviso that at least one of a or a' is a primary amino group; n is an integer from 1 to 4; the R groups, alike or different, are alkyl groups of 1 to 6 carbon atoms or substituted alkyl groups. Preferred developing agents include p-phenylenediamines in which one amino function is primary and the other is substituted with two alkyl groups, p-aminophenols, amino-substituted hydroxypyrazoles, and aminopyrazolines.

Suitable developing agents include:
4-amino-3-methyl-N-ethyl-N-($\beta$-hydroxyethyl)aniline,
N,N-diethyl-p-phenylenediamine,
4-amino-3-methyl-N,N-diethylaniline,
4-amino-N-ethyl-N-($\beta$-methylsulfonylaminoethyl)aniline,
4-amino-N-ethyl-N-($\beta$-hydroxyethyl)aniline,
4-amino-3-chloro-N,N-diethylaniline,
4-amino-3-ethoxy-N,N-diethylaniline,
4-amino-N-ethyl-N-methylaniline,
4-amino-N-ethyl-N-propylaniline,
1-(p-aminophenyl)-3-amino-$\Delta^2$-pyrazoline,
1,3-dimethyl-4-amino-5-hydroxypyrazole,
o-aminophenol,
o-phenylenediamine,
p-aminophenol,
p-phenylenediamine.

The developing agent can be employed in a developer solution comprising developing agent in water or water-soluble organic solvents. The developing agent can also be incorporated in the photosensitive element itself as a subcoating, topcoating, or it can be mixed with the polymeric coupler to provide an integral structure containing the developing agent. When the developing agent is incorporated in the photosensitive layer, it is generally advantageous to utilize a protected developer or developer precursor, i.e., a masked developer, so that the premature oxidation and reaction of the developer is prevented. Acid salts of the developing agent are also suitable for use. Such developers are known in the art and are discussed in "The Theory Of the Photographic Process", pages 325 and 326, vide supra. In this case, the solution employed in the developing step (b) is an activator solution (for the developing agent) such as aqueous base.

The developer solutions used according to the invention can contain additives conventionally employed in developer solutions. For example, alkaline agents such as sodium hydroxide, ammonium hydroxide, potassium carbonate, potassium bicarbonate, and sodium carbonate are useful as development accelerators. Sodium sulfite can be employed to improve storage stability; see Mason, "Photographic Processing Chemistry", Second Edition, Focal Press, New York, 1975, pages 121 and 122. Conventional developer superadditives such as 1-phenyl-3-pyrazolidone and N-methyl-p-aminophenol can also be added. The superadditiive can be added directly to the developer solution or it can be incorporated within the photosensitive element.

Alternatively, when the developing agent is incorporated in the photosensitive element, the superadditive can be added to the activator solution. Sodium sulfate can be used as a swelling suppressant; hydroxylamine salts and sodium sulfite are used as antioxidants; antifoggants include 6-nitrobenzimidazole salts and alkali metal halides such as potassium bromide; solubilizing agents include benzyl alcohol, 2-ethoxyethanol, 2-methoxyethanol, 2-butoxyethanol and 2-(2-butoxyethoxy)ethanol. Water softeners, wetting agents, pH buffers and the like can also be present. The pH of the developer solutions is preferably about 9 to 12.5, most preferably about 9.4 to 11.5.

The pH and salt content of the developer solutions are adjusted so that swelling but not dissolution of the photosensitive layer occurs during the developing step. When a water-insoluble polymeric coupler is used, the pH of the developer solution is increased and the salt concentration is adjusted so that swelling but not dissolution of the polymeric layer occurs.

The quantity of developing agent employed is not critical. When developer solutions are employed, the developing agent usually amounts to about 0.1 to 10 g/l of solution, preferably about 0.25 to 4 g/l. The ratio of developing agent to polyfunctional coupler is not critical, but sufficient developing agent should be present to effect satisfactory coupling and insolubilization. Preferably, at least about 1.0 mole of developing agent for each equivalent of coupler group is employed.

Washout (Step (iii))

The undeveloped, soluble areas of the polymeric coupler layer are removed by washing with water, an aqueous solution of solids such as alkali metal carbonates, hydroxides, silicates, phosphates, sulfates, and halides, or a semiaqueous solution of water and a water-miscible organic solvent. Suitable organic solvents include methanol, ethanol, 2-propanol, 2-ethoxyethanol, 2-butoxyethanol, 2-(butoxyethoxy)ethanol, and glycerol. Spray washout and brushing are preferred for removal of the undeveloped areas. When a separate silver halide emulsion layer is employed, this entire layer can be removed during the washing step.

For certain applications, one or more conventional finishing steps can be included. Such steps including fixing after development or before or during washout, treatment with an oxidizing agent, acid treatment, hardening with polyvalent metal ions such as calcium, magnesium or borate ions, treatment with surface active agent, and the like. The element is dried in a conventional manner.

The novel process of this invention provides a water-insoluble polymeric relief image with good resolution over a wide range of exposure speeds including camera speeds. In addition, the process is operable with low silver halide coating weights, e.g., as low as about 2 mg/dm$^2$. The process is applicable for a wide variety of uses including the preparation of lithographic films and plates, computer output microfilm, recording films and photoresists.

Advantages of the photosensitive elements of this invention are relative oxygen-insensitivity and their faster speed compared with conventional photopolymerizable imaging systems. Furthermore, since insolubilization of the developed polymeric coupler results from a change in hydrophobicity and acidity rather than from cross-linking, dot etching in organic solvents can be carried out to correct print density. An additional advantage is that commercially available, inexpensive developing agents can be employed.

The process of the invention can be employed for the preparation of both negative and positive images. In the preparation of a negative image, the areas insolubilized correspond to the areas exposed to light, whereas for a positive image, the areas insolubilized correspond to the unexposed areas. The type of image obtained depends on the character of the silver halide used. Thus, a normal negative-working silver halide yields a negative polymer image while a positive-working silver halide, such as one prepared by well-known solarization or chemical fogging techniques, yields a positive polymer image.

The following Examples illustrate the invention. All parts and percentages are by weight and temperatures are in degrees Celsius unless otherwise stated. Unless indicated to the contrary, concentrations of coupler groups and acid groups represent calculated values.

EXAMPLE 1

The Photosensitive Element

A. Preparation of Acetoacetate Polymeric Coupler

A solution of 1.60 g of a phosphate ester anionic surfactant in acid form in 30 ml of distilled water was titrated to pH 7 with 2% sodium hydroxide solution. Distilled water was added to give a total of 163 g of solution. The solution was placed in a flask equipped with a stirrer, condenser, thermometer and nitrogen inlet tube, and nitrogen was bubbled through the solution to remove oxygen. The flask was placed in a 60°-water bath, and 0.20 g of potassium peroxydisulfate was added with slow stirring. The solution was next stirred at high speed while a monomer solution consisting of 4.00 g of the acetoacetic ester of $\beta$-hydroxyethyl methacrylate, 14.00 g of methyl methacrylate, 18.00 g of ethyl acrylate, 4.00 g of methacrylic acid, and 0.20 g of lauryl mercaptan, was added. High speed stirring was continued for an additional 0.5 min, then the stirring speed was reduced to low speed while the polymerization emulsion was heated at 57° to 64° for 1.0 hr. The water bath was removed and 0.20 g of sodium bisulfite was added. The mixture was stirred for 10 min and filtered through a coarse fritted glass filter. There was obtained 191 g of acetoacetate polymeric coupler emulsion which had a pH of 5.2 and a solids content of 22%. The number average molecular weight was found to be 44,000 by gel permeation chromatography (GPC). Coupler groups: 47 meq/100 g of polymeric coupler; carboxyl groups: 116 meq/100 g of polymeric coupler.

B. Emulsion Preparation and Coating

A silicate-coated anodized aluminum plate was spin coated with a mixture of 8.10 g of acetoacetate polymeric coupler emulsion of part A and 13.52 g of a silver halide dispersion in water consisting of 10% ortho-sensitized, negative-working $AgBr_{0.985}I_{0.015}$ grains with an average equivalent edge size of 0.28 $\mu$m (or 0.02 $\mu$m$^3$ volume). After drying, the coating weight was about 10 mg/dm$^2$.

Developer Solutions

Developer solutions were prepared by the following procedure. Reagents were mixed, under nitrogen, in the following order:

0.8 ml of 5% potassium bromide in distilled water,
1.0 ml of 5% sodium sulfite in distilled water,
0.4 ml of 2.5% 2-phenyl-4-methyl-4-hydroxymethyl-5-pyrazolidone (Dimezone-S) in 1/1 methanol/water, and
89.7 ml of distilled water.

Nitrogen was bubbled through the solution for 5 minutes and then the following reagents were added:
- 0.10 g of a monofunctional developing agent,
- 4.00 g of potassium bicarbonate, and
- 4.00 g of potassium carbonate.

Developer solutions were prepared as described using the following monofunctional developing agents:

B5: 4-amino-3-methyl-N-ethyl-N-(β-hydroxyethyl)aniline sulfate,
B6: N,N-diethyl-p-phenylenediamine hydrochloride,
B7: 4-amino-3-methyl-N,N-diethylaniline hydrochloride,
B8: 4-amino-N-ethyl-N-(β-methylsulfonylaminoethyl)aniline.1.5 sulfate,
B9: 4-amino-N-ethyl-N-(β-hydroxyethyl)aniline.0.5 sulfate.

Exposure, Development and Washout

The coated plates were contact exposed through a process transparency which contained 2%, 5%, 50%, 95% and 98% 150 line halftone dots for 2, 4, and 8 sec using an incandescent lamp at a distance of 46 in (117 cm). The lamp was adjusted to give radiation of 10 ft-candles at 12 in (30.5 cm) distance. After exposure, the plates were immersed in developer solution B5 for 3.0 min at 32°. The plates were spray-washed with water to remove unexposed areas. A sharp hydrophobic polymer image remained in the exposed areas, and 2% to 98% halftone dots were present.

EXAMPLE 2

A silicate-coated anodized aluminum plate was spin coated with a mixture of 15.22 g of acetoacetate polymeric coupler emulsion of Example 1A and 28.19 g of the silver halide dispersion of Example 1B. The dried coating weight was about 19 mg/dm$^2$. The plate was exposed, developed, and spray washed as described in Example 1 except that the exposure time was 6 sec. An excellent negative image was obtained, and 2% to 95% 150 line halftone dots were present.

EXAMPLES 3 TO 7

The Photosensitive Element

A. Preparation of Acetoacetate Polymeric Coupler

An acetoacetate polymeric coupler was prepared by the procedure described in Example 1 except that the following monomer solution was employed:
- 4.80 g of the acetoacetic ester of β-hydroxyethyl methacrylate,
- 13.20 g of methyl methacrylate,
- 18.00 g of ethyl acrylate,
- 4.00 g of methacrylic acid,
- 0.40 g of lauryl mercaptan.

A total of 155.4 g of acetoacetate polymeric coupler emulsion was obtained having a pH of 5.2 and a solids content of 25%. The number average molecular weight was found to be 36,000 by GPC. Coupler groups: 56 meq/100 g of the polymeric coupler; Carboxyl groups: 116 meq/100 g of polymeric coupler.

b. Emulsion Preparation and Coating

A silicate-coated anodized aluminum plate was spin coated with a mixture of 8.57 g of acetoacetate polymeric coupler emulsion of part A and 22.55 g of the silver halide dispersion of Example 1. After drying, the coating weight was about 9.8 mg/dm$^2$.

Exposure, Development And Washout

Portions of the plate were exposed, developed, and spray washed as described in Example 1. All exposure times were 2 sec, and the developers listed in the following Table were employed. The results summarized in the Table show that all the developers gave excellent negative images, after washout, with 2% to 98% halftone dots present in all plates.

TABLE

|  | Developer Solution | | | | |
|---|---|---|---|---|---|
|  | B5 | B6 | B7 | B8 | B9 |
| Optical Density (Unexposed/Exposed) | 0.35/ 1.05 (Ex. 3) | 0.36/ 1.16 (Ex. 4) | 0.37/ 1.24 (Ex. 5) | 0.35/ 1.02 (Ex. 6) | 0.34/ 1.05 (Ex. 7) |

EXAMPLES 8 AND 9

The Photosensitive Element

A. Preparation of Pyrazolone Polymeric Coupler

A solution of 3.20 g of a phosphate ester anionic surfactant in acid form in 60 ml of distilled water was titrated to pH 7 with 2% sodium hydroxide solution, and distilled water was added to give a total of 327 g of solution. The solution was placed in a flask equipped with a stirrer, condenser, thermometer, and nitrogen inlet tube, and nitrogen was bubbled through the solution to remove oxygen. Potassium peroxydisulfate, 0.40 g, was added to the solution and it was heated to 55° in a water bath. The solution was stirred at high speed while a monomer solution, preheated to 90°, consisting of 8.00 g of 1-phenyl-3-methacrylamido-5-pyrazolone, 28.00 g of methyl methacrylate, 36.00 g of ethyl acrylate, 8.00 g of methacrylic acid, and 0.40 g of lauryl mercaptan was added all at once. Rapid stirring was continued for 30 sec, the stirring was slowed and continued for 75 min at 59° to 68°. The water bath was removed and 0.4 g of sodium bisulfite was added. The mixture was stirred for 5 min and filtered through a coarse fritted glass filter to obtain 385 g of pyrazolone polymeric coupler emulsion which had a pH of 5.3 and a solids content of 20.5%. The number average molecular weight was found to be 57,000 by GPC.

The 1-phenyl-3-methacrylamido-5-pyrazolone was prepared by acylation of 1-phenyl-3-amino-5-pyrazolone with an excess of methacrylyl chloride at 40° in pyridine by the following procedure. To a 500 ml three-necked flask fitted with a stirrer and thermometer there were added 35 g (0.2 mol) of 1-phenyl-3-amino-5-pyrazolone and 200 ml of dry pyridine. The mixture was stirred and the temperature held at 40° to 42°, and 42 g (0.4 mol) of methacrylyl chloride was added dropwise. After completion of the addition, the mixture was warmed to 75°. It was then poured onto cracked ice and allowed to stand overnight. The above-named product was filtered on a suction filter, washed with water and then recrystallized from ethanol. Coupler groups: 41 meq/100 g of polymeric coupler; carboxyl groups: 116 meq/100 g of polymeric coupler.

B. Emulsion Preparation and Coating

Silicate-coated, anodized aluminum plates were spin coated as follows:

Plate R (Example 8)

5.93 g of pyrazolone polymeric coupler emulsion of part A, 7.52 g of silver halide dispersion of Example 1,
0.52 g of distilled water.

Plate S (Example 9)

5.93 g of pyrazolone polymeric coupler emulsion of part A,
8.46 g of silver halide dispersion of Example 1,
0.29 g of distilled water.

After drying, the coating weights of each plate were about 10 mg/dm$^2$.

Exposure, Development And Washout

Portions of the plates were exposed for 1 sec as described in Example 1, and they were developed with developer B5 for 3 min at 32°. The developed plates were spray washed with water to give good hydrophobic images with 2% to 95% halftone dots. Plate R exhibited an optical density of 0.59/1.03 (unexposed/exposed). The optical density of Plate S was 0.58/0.97 (unexposed/exposed).

EXAMPLE 10

A large (8-½×22-½ in.; 21.6×57.2 cm) silicate-coated anodized aluminum plate was spin coated with the composition described in Paragraph B of Examples 3 to 7. The coated plate was exposed in a Robertson 320 process camera for 6 sec at f 16 with a process transparency illuminated from behind by two 1500 W (3200° K.) lamps. The exposed plate was developed with developer B5 for 3 min at 32°, and the unexposed areas were removed by spray washing with water. The plate was immersed in a 2% aqueous acetic acid solution for 2 min. at 24°, air-dried for several hours and finally dried at 98° for 10 min. The plate was used to print 14,200 copies on a Miehle Offset lithographic printing press. No plate wear was apparent. Excellent prints with 4% to 90% 150 line/in halftone dots were obtained.

EXAMPLE 11

The Photosensitive Element

A. Preparation of Pyrazolone Polymeric Coupler

An acrylic copolymer containing pyrazolone coupler groups was prepared by heating at reflux for 8 hours a t-butyl alcohol solution of a mixture of 43 parts of ethyl acrylate, 35 parts of methyl methacrylate, 10 parts of methacrylic acid and 12 parts of 1-phenyl-3-methacrylamido-5-pyrazolone in the presence of 0.4 part of azobisisobutyronitrile initiator, added in portions. The solution was poured into water to precipitate the copolymer, and the precipitated copolymer was heated with steam to remove volatiles. The number average molecular weight of the polymer measured by gel permeation chromatography was found to be approximately 32,000 using poly(methyl methacrylate) standards. Calc. for sum of coupler groups plus carboxyl groups: 165 meq acid/100 g of polymeric coupler. Found: 185 (potentiometric titration with tetrabutylammonium hydroxide in tetrahydrofuran solution). A polymer solution was prepared by dissolving 10 g of the copolymer in 70 g of water and 1.25 ml of concentrated ammonia (29%).

B. Emulsion Preparation and Coating

Under photographic safelights, a light-sensitive silver halide emulsion was prepared by adding one part of the polymer solution of part A to one part of a silver halide dispersion in water consisting of 12% ortho sensitized negative-working AgBr$_{0.985}$I$_{0.015}$ grains with an average equivalent edge size of 0.28 μm (or 0.02 μm$^3$ volume). The mixture was filtered and spin coated onto silicate-treated, anodized, grained aluminum plates. Coating weights were 22 mg/dm$^2$ corresponding to a silver halide coating weight of about 11 mg/dm$^2$.

Exposure, Development and Washout

Developer stock solutions were prepared as follows:

Solution A—A solution was made from 1.0 g of 4-amino-3-methyl-N-ethyl-N-(β-hydroxyethyl)aniline sulfate and 19 g of water.

Solution B—A buffer solution was made by dissolving 100 g of potassium carbonate and 100 g of potassium bicarbonate in 800 ml of water.

Solution C—A solution was made by mixing 198.6 g of solution B, 0.20 g of Dimezone-S, 1.0 g of sodium sulfite, and 0.20 g of potassium bromide. It was protected from oxygen by storing under a nitrogen atmosphere.

An active developer solution was prepared by mixing 100 ml of solution C, 400 ml of solution B and 480 ml of water followed by 20 g of solution A. The developer solution was stored under nitrogen until used.

A coated plate was exposed 3.5 sec at a lens opening of f 16 in a process camera to a negative illuminated from behind by 3000 watts of incandescent light (3200° K.).

The exposed plate was sequentially immersed in active developer at 26° for two minutes, rinsed a few seconds in 13° water, sprayed with a 13°-mixture of 20 psi (138 kPa) air and water, rinsed with 13° water, soaked five minutes in 2% acetic acid-water at 13°, air-dried, and rubbed up with a thin protective coating of asphaltum gum etch.

Image and Printing

A dark magenta water-repellent image was retained in the light struck areas, and the original surface of the aluminum plate was laid bare in the unexposed areas. The image was excellent except for some dot loss at one end of the plate. The plate was used on a Miehle offset lithographic printing press with process black ink to print 4000 copies on 70 lb uncoated paper. The prints were excellent with 2% to 98% 150 line per inch halftone dots. At the end of 4000 prints the plate was unchanged and could have been used to print many more copies.

EXAMPLE 12

The Photosensitive Element

A. Preparation of Acetoacetate Polymeric Coupler

Acetoacetate polymeric coupler was prepared by polymerization of the monomers in solution. In a reaction flask equipped with a stirrer, condenser, addition funnel, and nitrogen inlet tube was placed 4.00 g of the acetoacetic ester of β-hydroxyethyl methacrylate, 24.40 g of ethyl acrylate, 2.16 g of methacrylic acid, 6.31 g of methyl methacrylate and 60 ml of 2-butanone. Nitrogen was bubbled through the solution to remove oxygen. The reactants were heated to reflux and a solution of 0.80 g of azobisisobutyronitrile in 7.09 g of methyl methacrylate was added all at once with stirring. A feed mixture of 5.60 g of the acetoacetic ester of β-hydroxyethyl methacrylate, 13.00 g of ethyl acrylate, 5.04 g of methacrylic acid, 12.40 g of methyl methacrylate, 90 ml of 2-butanone, and 0.80 g of azobisisobutyronitrile was then added dropwise over 20 min at reflux.

The reaction mixture was then stirred and heated at reflux an additional 45 min. The steam bath was removed and 3.73 g of N,N-dimethylethanolamine was added with vigorous stirring followed by the addition of 186.7 g of distilled water. The 2-butanone solvent was removed from the resulting emulsion under reduced pressure at 35° to 40°. An additional 1.87 g of N,N-dimethylethanolamine was then added with good stirring. Solids content was adjusted to 25% by addition of 87.6 g of distilled water. Coupler groups: 57 meq/100 g of polymeric coupler; carboxyl groups: 105 meq/100 g of polymeric coupler.

B. Emulsion Preparation and Coating

A silicate-coated anodized aluminum plate (Advance MR) was spin coated with a mixture of 15.72 g of the acetoacetate polymeric coupler emulsion of Part A, 5.94 g of distilled water and 29.61 g of the silver halide dispersion of Example 1. After drying, the coating weight was about 18.9 mg/dm$^2$.

Exposure, Development, and Washout

A coated plate was exposed for 20 sec as described in Example 1, and it was developed for 3 min at 26° in a developer solution prepared by mixing in order, under nitrogen atmosphere, the following reagents:
834.3 g: distilled water
0.40 g: potassium bromide
0.50 g: sodium sulfite
10 drops: 85% phosphoric acid
0.10 g: Dimezone-S (recrystallized from ethanol) dissolved, then added
1.00 g: B5 developing agent dissolved, then added
94.3 g: disodium phosphate heptahydrate
69.4 g: trisodium phosphate dodecahydrate.

The developed plate was spray-washed and then soaked in 2% acetic acid stop bath for 5 min. The dot diameters were measured using a microscope equipped with a filar micrometer eyepiece. The dots were etched by immersing the plate in acetone at about 22° for 5 min. Dot diameters were then remeasured and the decrease in dot areas noted. Results are summarized in the Table.

TABLE

| Developed Plate. Percent Dot | Percent Decrease In Dot Area Caused By Etching |
|---|---|
| 2 | 17.9 |
| 5 | 10.1 |
| 50 | 12.1 |
| 95 | 31.9 |
| 98 | 63.8 |

EXAMPLE 13

The Photosensitive Element

A. Preparation of Acetoacetate Polymeric Coupler

A solution of 1.60 g of a phosphate ester anionic surfactant in acid form in 30 ml of distilled water was titrated to pH 7 with 2% potassium hydroxide solution. Distilled water was added to give a total of 81.2 g of solution. The solution was placed in a flask equipped with a stirrer, condenser, thermometer and nitrogen inlet tube, and nitrogen was bubbled through the solution to remove oxygen. The flask was placed in a 60°-water bath, and 0.20 g of potassium peroxydisulfate was added with slow stirring. The solution was next stirred at high speed while a monomer solution containing 8.00 g of the acetoacetic ester of β-hydroxyethyl methacrylate, 13.20 g of methyl methacrylate, 18.00 g of ethyl acrylate, 0.80 g of methacrylic acid, and 0.32 g of lauryl mercaptan, was added. High speed stirring was continued for an additional 0.5 min, then the stirring speed was reduced to low speed while the polymerization emulsion was heated at 56° to 62° for 1.0 hr. The water bath was removed and 0.20 g of sodium bisulfite was added. The mixture was stirred for 10 min and filtered through a coarse fritted glass filter. There was obtained 118 g of acetoacetate polymeric coupler emulsion which had a pH of 4.9 and a solid content of 30.8%. The polymer contained 93 meq of acetoacetate coupler and 23 meq of carboxylic acid per 100 g of polymer.

B. Emulsion Preparation and Coating

A silicate-coated anodized aluminum plate was spin coated with a mixture of 1.63 g of acetoacetate polymeric coupler emulsion of Part A, 3.93 g of the silver halide dispersion of Example 1, and 1.11 g of distilled water. The dried coating weight was about 14 mg/dm$^2$.

Exposure, Development and Washout

The plate was exposed for 10 sec as described in Example 1, then developed for 4 min at 32° in a developer solution prepared under nitrogen from the following reagents:
752 g of distilled water
0.40 g of potassium bromide
0.50 g of sodium sulfite
0.10 g of Dimezone-S
1.00 g of 4-amino-3-methyl-N-ethyl-N-(β-hydroxyethyl)aniline sulfate
141.63 g of dibasic sodium phosphate heptahydrate
104.35 g of tribasic sodium phosphate dodecahydrate.

The plate was spray washed with water to remove the coating in unexposed areas. A sharp hydrophobic polymer image was retained in the exposed areas. The optical density was 0.43/1.28 (unexposed/exposed).

EXAMPLE 14

The Photosensitive Element

A. Preparation of Pyrazolone Polymeric Coupler

A solution of 1.60 g of a phosphate ester anionic surfactant in acid form in 30 ml of distilled water was titrated to pH 7 with 20% potassium hydroxide solution. Distilled water was added to give a total of 81.2 g of solution. The solution was placed in a flask equipped with a stirrer, condenser, thermometer and nitrogen inlet tube, and nitrogen was bubbled through the solution to remove oxygen. The flask was placed in a 70°-water bath, and 0.20 g of potassium peroxydisulfate was added with slow stirring. The solution was next stirred at high speed while a monomer solution consisting of 2.80 g of 1-phenyl-3-methacrylamido-5-pyrazolone, 11.60 g of methyl methacrylate, 20.00 g of ethyl acrylate, 5.60 g of methacrylic acid, and 0.32 g of lauryl mercaptan, was added. High speed stirring was continued for an additional 0.5 min, then the stirring speed was reduced to low speed while the polymerization emulsion was heated at 59° to 72° for 1.0 hr. The water bath was removed and the reaction mixture was filtered through a coarse fritted glass filter. There was obtained 90.2 g of pyrazolone polymeric coupler emulsion which had a pH of 4.6 and a solids content of 27.9%. The polymer contained 12 meq of pyrazolone coupler and 163 meq of carboxylic acid per 100 g of polymer.

B. Emulsion Preparation and Coating

A silicate-coated anodized aluminum plate was spin coated with a mixture of 3.58 g of the pyrazolone polymeric coupler emulsion of Part A and 8.13 g of the silver halide dispersion of Example 1. The dried coating weight was about 14 mg/dm².

Exposure, Development and Washout

The plate was exposed for 5 sec as described in Example 1, then developed for 4 min at 26° in a developer solution prepared from the following reagents:
  896 g of distilled water
  0.40 g of potassium bromide
  0.50 g of sodium sulfite
  0.10 g of Dimezone-S
  1.00 g of 4-amino-3-methyl-N-ethyl-N-(β-hydroxyethyl)aniline sulfate
  12 g of potassium bicarbonate
  90 g of potassium carbonate.

The plate was spray washed with water to remove the coating in the unexposed areas. A sharp hydrophobic polymer image was retained in the exposed areas. The optical density was 0.43/0.98 (unexposed/exposed).

EXAMPLE 15

The Photosensitive Element

A. Preparation of Pyrazolone Polymeric Coupler

The pyrazolone polymeric coupler was prepared as described in Example 11 except that the monomer composition was modified to yield a polymer with a lower $T_g$. The following composition was used:
  65 parts of ethyl acrylate
  15 parts of methyl methacrylate
  8 parts of methacrylic acid
  12 parts of 1-phenyl-3-methacrylamido-5-pyrazolone.

B. Emulsion Preparation and Coating

A coating solution was prepared as described in Example 11 using the polymeric coupler solution of Part A. The solution was coated by doctor knife onto 1-mil (25-μm) oriented polyester film to give a coating weight, after drying, of about 30 mg/dm². Before coating, the oriented polyester film was "glued" with water to the antihalation side of a piece of standard film base to obtain improved substrate rigidity.

Exposure, Development and Washout

A portion of the coated film was exposed for 9 sec as described in Example 1, then developed with developer solution B5 for 1 min at 26°. The film was spray washed with water to remove the coating in the unexposed areas. A sharp polymer image, maximum optical density of 1.9, remained, and 2 to 98% dots were visible.

Two additional portions of exposed film were developed as described except that the developer solutions contained 10× and 100× the level of sodium sulfite in the B5 developer solution. Good washout images were obtained with maximum optical densities of 1.6 and 0.7, respectively.

EXAMPLE 16

A coated film, prepared as described in Example 15, was exposed for 6 sec as described in Example 1, then developed for 2 min at 26° in a freshly-prepared developer solution, prepared by modifying developer solution B5 to contain a 5-fold higher level of 4-amino-3-methyl-N-ethyl-N-(β-hydroxyethyl)aniline sulfate and a 100-fold higher level (50 g/l) of sodium sulfite. A sharp polymeric image, maximum optical density of 2.2, remained, and 2 to 98% dots were visible.

After standing for 2 weeks in air, the developer stock solution was still active; development of a piece of exposed film followed by spray washout gave an excellent polymer image, maximum optical density of 1.5. This Example demonstrates the advantage of using an increased concentration of sulfite to stabilize the developer solution without substantially inhibiting the development reaction.

The embodiments of the invention in which an exclusive property or privilege is claimed are defined as follows:

1. A method for forming a polymer photoimage, comprising:
    (a) exposing, imagewise, a photosensitive element to actinic radiation, the element comprising a substrate coated with a photosensitive layer containing dispersed silver halide particles in operative association with a continuous film-forming phase of polymeric coupler, the coupler characterized by
        (i) a number average molecular weight of about 2,000 to 100,000;
        (ii) a content of about 10 to 100 milliequivalents per 100 g of polymeric coupler of coupler groups and about 15 to 175 milliequivalents per 100 g of polymeric coupler of at least one of carboxylic, sulfonic and phosphonic acid groups; and
        (iii) the ability to couple with a monofunctional developing agent and thereby become insoluble in aqueous solvents;
    (b) developing the layer containing the latent image with a monofunctional developing agent capable of selectively reducing the silver halide in the latent image area and, in its oxidized state, of coupling with the polymeric coupler in the latent image area, thereby insolubilizing the coupler in the form of an image; and
    (c) removing the undeveloped, soluble areas of the polymeric coupler by washing with aqueous solvent.

2. A method according to claim 1 wherein the polymeric coupler contains acetoacetate coupling groups.

3. A method according to claim 1 wherein the polymeric coupler contains pyrazolone coupling groups.

4. A method according to claim 1 wherein the substrate is aluminum.

5. A method according to claim 1 wherein the substrate is copper.

6. A method according to claim 1 wherein the substrate is oriented polyethylene terephthalate film.

7. A method according to claim 1 wherein the molecular weight of the polymeric coupler is about 5,000 to 60,000.

8. A method according to claim 1 wherein the developing agent has as its nucleus an active group with the structure:

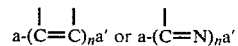

where a and a', alike or different, are OH, NH$_2$, NHR, or NR$_2$ with the proviso that at least one of a or a' is a primary amino group; n is an integer from 1 to 4; the R groups, alike or different, are alkyl groups of 1 to 6 carbon atoms or substituted alkyl groups.

9. A method according to claim 1 in which the developing agent is incorporated in the photosensitive element, comprising treating the exposed layer, in step (b), with an activator solution for the developing agent.

10. A method according to claim 2 wherein the substrate is aluminum.

11. A method according to claim 2 wherein the substrate is copper.

12. A method according to claim 2 wherein the substrate is oriented polyethylene terephthalate film.

13. A method according to any one of claims 10, 11, or 12, wherein the developing agent is 4-amino-3-methyl-N-ethyl-N-($\beta$-hydroxyethyl)aniline sulfate.

14. A method according to claim 3 wherein the substrate is aluminum.

15. A method according to claim 3 wherein the substrate is copper.

16. A method according to claim 3 wherein the substrate is oriented polyethylene terephthalate film.

17. A method according to any one of claims 14, 15, or 16 wherein the developing agent is 4-amino-3-methyl-N-ethyl-N-($\beta$-hydroxyethyl)aniline sulfate.

* * * * *